United States Patent
Sun

(10) Patent No.: US 12,071,158 B2
(45) Date of Patent: Aug. 27, 2024

(54) APPARATUS AND METHOD OF CREATING SCENARIO FOR AUTONOMOUS DRIVING SIMULATION

(71) Applicant: WOVEN BY TOYOTA, INC., Tokyo (JP)

(72) Inventor: Linyu Sun, Miyoshi (JP)

(73) Assignee: WOVEN BY TOYOTA, INC., Tokyo (JP)

( * ) Notice: Subject to any disclaimer, the term of this patent is extended or adjusted under 35 U.S.C. 154(b) by 237 days.

(21) Appl. No.: 17/687,108

(22) Filed: Mar. 4, 2022

(65) Prior Publication Data

US 2023/0278578 A1 Sep. 7, 2023

(51) Int. Cl.
  *B60W 60/00* (2020.01)
  *B60W 40/04* (2006.01)
  *G01M 17/00* (2006.01)

(52) U.S. Cl.
  CPC .......... *B60W 60/001* (2020.02); *B60W 40/04* (2013.01); *G01M 17/00* (2013.01); *B60W 2554/4041* (2020.02); *B60W 2554/4049* (2020.02)

(58) Field of Classification Search
  CPC ............... B60W 60/001; B60W 40/04; B60W 2554/4041; B60W 2554/4049; G01M 17/00
  See application file for complete search history.

(56) References Cited

U.S. PATENT DOCUMENTS

| | | | | |
|---|---|---|---|---|
| 2014/0297243 | A1* | 10/2014 | Suzumura | G06F 30/20 703/6 |
| 2017/0043769 | A1* | 2/2017 | Madas | B60W 30/095 |
| 2021/0056838 | A1* | 2/2021 | Hyodo | G08G 1/091 |
| 2022/0266859 | A1* | 8/2022 | Semple | G07C 5/0841 |

FOREIGN PATENT DOCUMENTS

| | | |
|---|---|---|
| JP | 2009-093425 A | 4/2009 |
| JP | 2019-117329 A | 7/2019 |
| WO | 2021/244956 A1 | 12/2021 |

* cited by examiner

*Primary Examiner* — Peter D Nolan
*Assistant Examiner* — Mikko Okechukwu Obioha
(74) *Attorney, Agent, or Firm* — Sughrue Mion, PLLC

(57) ABSTRACT

A method and apparatus for creating a scenario for an autonomous driving simulation. The method includes setting, based on a first user input, a location of a first target object at each of a first plurality time points on a map for a simulation scenario, the first plurality of time points comprising a first time point and a third time point; and defining, based on a second user input, an action of a second target object that is different from the first target object in relation to at least one of the set locations of the first target object.

15 Claims, 6 Drawing Sheets

APPARATUS AND METHOD OF CREATING SCENARIO FOR AUTONOMOUS DRIVING SIMULATION

BACKGROUND

1. Technical Field

The disclosure relates to the field of autonomous driving simulation technology, and in particular, to an apparatus and a method of providing a simulation scenario in which actions of an ego vehicle can be relatively defined with a non-ego vehicle actor.

2. Description of Related Art

As the development of autonomous vehicles evolves at an accelerated pace, so too has the development of autonomous vehicle software applications that control (or affect control of) the vehicles. A software or application developer for an autonomous vehicle (ego vehicle) must be able to test and verify the safety and proper functioning of an application in different scenarios, before the application's release. This is done using an autonomous driving simulation system that simulates an ego vehicle's operations in a given scenario. A related art autonomous driving simulation system includes a core simulator, a vehicle simulator, and one or more sensor simulators.

The core simulator is the simulation tool that creates, edits, and/or executes a scenario in which a simulation is run. Via the core simulator, the virtual world of the simulation can be defined, as well as the actors and their movements. For example, a scenario may include a pedestrian and a non-ego vehicle that move from their respective start points to destination points to test how the ego vehicle will behave in such a scenario.

Related art scenario creators and editors define the actions of each actor individually, without allowing definitions to be made on an actor-to-actor relative basis. As a result, it is difficult to create a scenario with an accurate representation of a relative timing between the actions of the actors, e.g., a relative collision timing, a relative distance and a relative rotation (or angle) between the actors. For example, when testing a behavior of an ego vehicle in response to a non-ego vehicle cutting in front of the ego vehicle, the related art scenario editor does not allow relative definitions to be made with respect to the ego vehicle and the non-ego vehicle cutting in front of the ego vehicle. Specifically, when simulating an ego vehicle behavior in response to a non-ego vehicle cutting 5 m in front of the ego vehicle with a relative speed of −5 km/h (i.e., 5 km/hr less than the ego vehicle speed) at a relative angle of 30 degrees, because the related art simulation scenario editor does not allow for these relative definitions or parameters to be set, it is difficult to obtain an accurate representation of the ego vehicle behavior in such a situation. The related art scenario editors only allow definitions of each actor to be set in a simple and non-relative terms, for example, definitions indicating the start and end points in which a non-ego vehicle is to travel or the start point with a distance to be traveled by the non-ego vehicle. Therefore, there is a need for a core simulator in which relative definitions between actors can be more precisely and easily defined to improve a simulation environment for testing autonomous vehicles.

SUMMARY

The present disclosure provides an apparatus and a method of providing an ego vehicle simulation scenario that defines the behavior of a non-ego vehicle actor relative to an ego vehicle (e.g., relative to ego-vehicle position and/or time).

An aspect of the present disclosure provides a method of creating a scenario for an autonomous driving simulation. The method includes: setting, based on a first user input, a location of a first target object at each of a first plurality time points on a map for a simulation scenario, the first plurality of time points comprising a first time point and a third time point; and defining, based on a second user input, an action of a second target object that is different from the first target object in relation to at least one of the set locations of the first target object.

In the above aspect, the defining the action of the second target object includes: setting, based on the second user input, a location of the second target object at each of a second plurality of time points on the map, the second plurality of time points comprising the first time point, the third time point, and a second time point between the first time point and the third time point.

In the above aspect, the method further includes: determining a location of the first target object at the second time point based on the set location of the first target object at the first time point and the set location of the first target object at the third time point.

In the above aspect, the method further includes: setting, for each of the first plurality of time points, at least one of a user-defined velocity and a user-defined rotation of the first target object; and setting, for each of the second plurality of time points, at least one of a user-defined velocity and a user-defined rotation of the second target object.

In the above aspect, the defining the action of the second target object includes: setting a user-defined trigger condition relative to the at least one of the set locations of the first target object, and a user-defined target action of the dynamic object to be performed based on the trigger condition being satisfied.

In the above aspect, the user-defined trigger condition includes at least one of a velocity of the first target object, a range from the first target object, an active area, and a target object type; and the user-defined target action includes at least one of target object relative velocity relative to the velocity of the first target object, target object relative distance or location relative to the first target object, and a time to collision.

Another aspect of the present disclosure provides an apparatus for creating a scenario for an autonomous driving simulation. The apparatus includes: at least one processor configured to: set, based on a first user input, a location of a first target object at each of a first plurality time points on a map for a simulation scenario, the first plurality of time points comprising a first time point and a third time point; and define, based on a second user input, an action of a second target object that is different from the ego-vehicle in relation to at least one of the set locations of the first target object.

In the above aspect, the at least one processor is further configured to set, based on the second user input, a location of the second target object at each of a second plurality of time points on the map, the second plurality of time points comprising the first time point, the third time point, and a second time point between the first time point and the third time point.

In the above aspect, the at least one processor is further configured to determine a location of the first target object at the second time point based on the set location of the first target object at the first time point and the set location of the first target object at the third time point.

In the above aspect, the at least one processor is further configured to: set, for each of the first plurality of time points, at least one of a user-defined velocity and a user-defined rotation of the first target object; and set, for each of the second plurality of time points, at least one of a user-defined velocity and a user-defined rotation of the second target object.

In the above aspect, the at least one processor is further configured to set a user-defined trigger condition relative to the at least one of the set locations of the first target object, and a user-defined target action of the second target object to be performed based on the trigger condition being satisfied.

In the above aspect, the user-defined trigger condition includes at least one of a velocity of the first target object, a range from the first target object, an active area, and a target object type; and the user-defined target action includes at least one of target object relative velocity relative to the velocity of the first target object, target object relative distance or location relative to the first target object, and a time to collision.

Another aspect of the present disclosure provides a non-transitory computer-readable storage medium, storing instructions executable by at least one processor to perform a method. The method includes: setting, based on a first user input, a location of a first target object at each of a first plurality time points on a map for a simulation scenario, the first plurality of time points comprising a first time point and a third time point; and defining, based on a second user input, an action of a second target object that is different from the first target object in relation to at least one of the set locations of the first target object.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION

Figure 1:
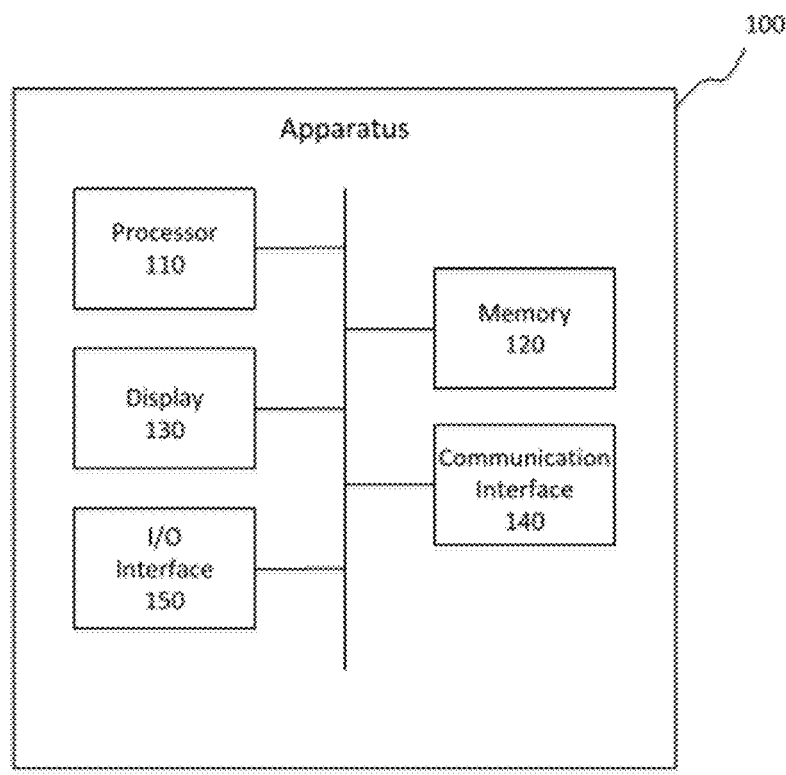
FIG. 1 is a block diagram illustrating an apparatus for providing simulation scenarios that define actions of at least one second target object relative to actions of a first target object, according to an embodiment.

Embodiments of the disclosure will be described in detail with reference to the accompanying drawings. The same reference numerals used in the drawings may identify the same or similar elements. The terms used in the disclosure should not be strictly construed as defined in the disclosure, but should be construed as those one of ordinary skilled in the art would understand in the context of the disclosure. It should be noted that the embodiments of the disclosure may be in different forms and are not limited to the embodiments of the disclosure set forth herein.

FIG. 1 is a block diagram illustrating an apparatus for providing autonomous driving simulation scenarios that define actions of one or more second target objects relative to a first target object according to an embodiment. According to an embodiment, the first target object is an ego vehicle, and the one or more second target objects are non-ego vehicle actors. It is understood, however, that other embodiments may not be limited thereto. For example, the first target object may be a non-ego vehicle and/or the at least one second target object may include an ego vehicle according to another embodiment.

A scenario editing apparatus 100 for providing autonomous driving simulation scenarios may include a processor 110, a memory 120, a display 130, a communication interface 140 and an input/output interface 150.

The processor 110 may control an overall operation of the apparatus 100. Specifically, the processor 110 may be connected to and configured to control the operations of the memory 120, the display 130, the communication interface 140 and the input/output interface 150. The processor 110 may be implemented according to various embodiments. For example, the processor 110 may be implemented as at least one of an application specific integrated circuit (ASIC), an embedded processor, a microprocessor, hardware control logic, a hardware finite state machine (FSM), a digital signal processor (DSP), a neural network processor (NPU), or the like. The processor 110 may include a central processing unit (CPU), a graphic processing unit (GPU), and a main processing unit (MPU), or the like. In addition, the processor 110 may include one or more processors.

The memory 120 may store at least one instruction and various software programs or applications for operating the apparatus 100 according to the embodiments of the disclosure. For example, the memory 120 may include a semiconductor memory, such as a flash memory, a magnetic storage medium such as a hard disk, or the like. The memory 120 may refer to any volatile or non-volatile memory, a read-only memory (ROM), a random access memory (RAM) communicatively coupled to the processor 110 or a memory card (e.g., a micro SD card, a memory stick) connectable to the apparatus 100. The memory 120 may store various software modules or codes for operating the apparatus 100, and the processor 110 may control the operations of the apparatus 100 by executing various software modules that are stored in the memory 120. That is, the memory 120 may be accessed by the processor 110 to perform data reading, recording, modifying, deleting, updating or the like. Further, the memory 120 may store executable instructions, code, data objects etc.

The display 130 may be implemented as a liquid crystal display (LCD) panel, organic light emitting diodes (OLED), a flexible display, a touch screen display, a transparent display, or the like. The processor 110 may control the display 130 to display image signals received from the memory 120 of the apparatus 100 or received from an external device through the communication interface 140. However, the implementation of the display 130 is not limited thereto.

The communication interface 140 may include circuitry or an interface that is configured to communicate with an external device (e.g., server) through a network. The communication interface 140 may include at least one of a Wi-Fi module, a Bluetooth module, a wireless communication module, or a near field communication (NFC) module. Specifically, the Wi-Fi module may communicate by a Wi-Fi method and the Bluetooth module may communicate by a Bluetooth method. When using the Wi-Fi module or the Bluetooth module, various connection information such as service set identifier (SSID) may be transmitted and received for communication connection and then various information may be transmitted and received through the communication interface 140.

The input/output interface 150 may be configured to receive an input from a user or other devices, and the processor 110 may receive a user command for controlling the operations of the apparatus 100 through the input/output interface 150. The input/output interface 150 may include, for example, a microphone, a camera, a remote controller, a keyboard, a mouse, or the like.

In addition, according to an embodiment, a method and an apparatus disclosed herein may be provided as software of a computer program product. A computer program product may be distributed in the form of a machine readable storage medium (e.g., compact disc read only memory (CD-ROM)) or distributed online through an application store or between two devices directly. In the case of on-line distribution, at least a portion of the computer program product (e.g., a downloadable app) may be stored temporarily or at least temporarily in a storage medium such as a manufacturer's server, a server in an application store, or a memory in a relay server.

Although some example components of the apparatus 100 are described above, it is understood that embodiments of the apparatus 100 are not limited thereto, and the apparatus 100 may include more or less components depending on the need for providing autonomous driving simulation scenarios.

Figure 2:
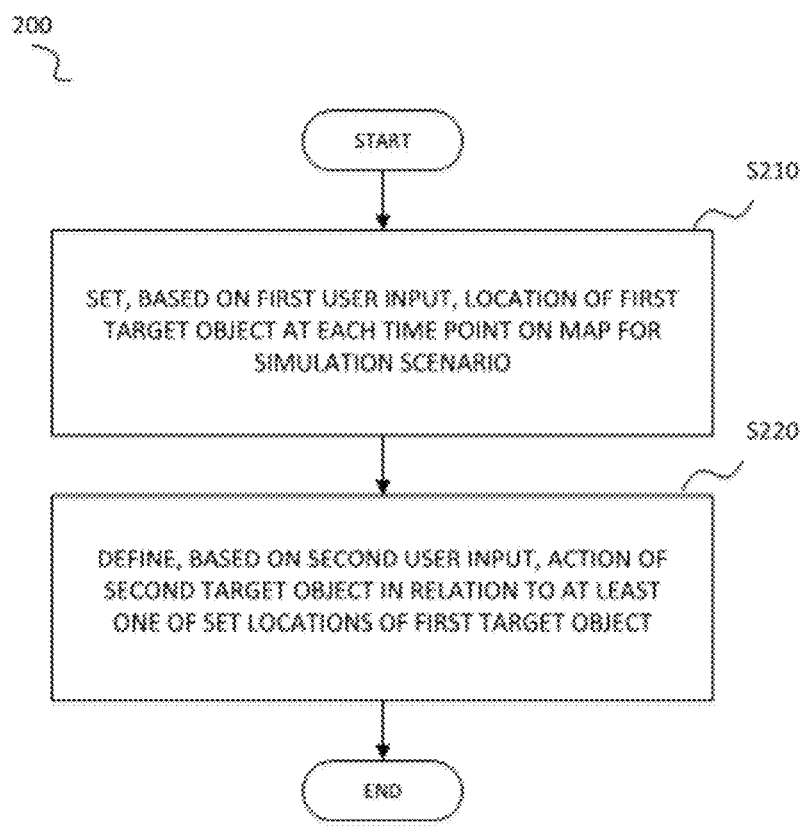
FIG. 2 is a flowchart illustrating a method of providing a simulation scenario that defines actions of a second target object in relation to actions of a first target object, according to an embodiment.

FIG. 2 is a flowchart illustrating a method of providing a simulation scenario that defines actions of a second target object in relation to actions of a first target object according to an embodiment.

According to an embodiment, a method 200 of providing a simulation scenario that defines actions of a second target object (e.g., a non-ego vehicle actor) in relation to actions of a first target object (e.g., an ego vehicle) may be performed or controlled, via executing instructions, by the processor 110 of the scenario editing apparatus 100 (shown in FIG. 1).

Referring to FIG. 2, in step S210, based on receiving a first user input, a location of a first target object for each of a first plurality of time points may be set. By way of example, the first user input may be made relative to a graphical user interface or input screen including a map (or a representation of a road) for an autonomous driving simulation scenario. In this case, the first user input may be made on the map, as an input of a location of the first target object on the map at a designated (or user input) time point. The first user input may include inputs to designate locations of the first target object, and the first plurality of time points may include, for example, a first time point and a third time point among a plurality of time points.

In step S220, based on receiving a second user input, an action of a second target object (or dynamic object such as a non-ego vehicle actor) may be defined in relation to at least one of the set locations of the first target object.

It is understood that the order of steps illustrated in FIG. 2 is not limiting. For example, steps S210 and S220 may be performed simultaneously or substantially simultaneously according to another embodiment, such that portions of step S210 are performed prior to and subsequent to portions of step S220.

The scenario editing apparatus 100 according to an embodiment may set time-synchronized or paired points on a map, in which each pair may include a time-synchronized set of defined attributes of the actors (or target objects). For example, the attributes may include a defined position, a rotation, and/or a velocity of a second target object (e.g., a non-ego vehicle such as a car, pedestrian, etc.) and the first target object (e.g., an ego vehicle). Referring to Table 1 below, for each of a plurality of time points (e.g., Time Point 1 to Time Point 4), at least one of a location, a rotation (or angle), and/or a velocity of an ego vehicle, as an example of the first target object, may be obtained. For example, at Time Point 1 (or the first time point), a position (X1a, Y1a), a velocity V1a and a rotation R1a may be obtained for the ego vehicle. Similarly, for each of the plurality of time points, at least one of a position, a rotation (or angle) and a velocity of a non-ego vehicle, as an example of the second target object, may be obtained. For example, at the first time point, a position (X1b, Y1b), a velocity V1b, and a rotation R1b may be obtained for the non-ego vehicle. The respective positions, velocities and rotations of the ego vehicle and the non-ego vehicle may be the time-synchronized set.

TABLE 1

| Actor(s) | Time Point 1 | Time Point 2 | Time Point 3 | Time Point 4 |
| --- | --- | --- | --- | --- |
| Ego Vehicle | Pos.: (X1a, Y1a)<br>Vel.: V1a<br>Rotation: R1a | Pos.: (X2a, Y2a)<br>Vel.: V2a<br>Rotation: R2a | Pos.: (X3a, Y3a)<br>Vel.: V3a<br>Rotation: R3a | Pos.: (X4a, Y4a)<br>Vel.: V4a<br>Rotation: R4a |
| Non-Ego Vehicle | Pos.: (X1b, Y1b)<br>Vel.: V1b<br>Rotation: R1b | Pos.: (X2b, Y2b)<br>Vel.: V2b<br>Rotation: R2b | Pos.: (X3b, Y3b)<br>Vel.: V3b<br>Rotation: R3b | Pos.: (X4b, Y4b)<br>Vel.: V4b<br>Rotation: R4b |

While the above example includes only one actor (e.g., non-ego vehicle) in addition to the ego vehicle, it is understood that one or more other embodiments are not limited thereto. In this regard, any number of additional actors (including pedestrians, ego vehicles, and additional non-ego vehicles) may be defined in the synchronized time points.

Further, in the above example, the same number of points are defined for each of the ego vehicle and the non-ego vehicle actor. It is understood, however, that one or more other embodiments are not limited thereto, and more or less time points may be set for the second target object (e.g., non-ego vehicle actor) as compared to the first target object (e.g., ego vehicle actor), or vice-versa, as exemplified in Table 2 below.

TABLE 2

| Actor(s) | Time Point 1 | Time Point 2 | Time Point 3 | Time Point 4 |
| --- | --- | --- | --- | --- |
| Ego Vehicle | Pos.: (X1a, Y1a) Vel.: V1a Rotation: R1a | | | Pos.: (X4a, Y4a) Vel.: V4a Rotation: R4a |
| Non-Ego Vehicle | Pos.: (X1b, Y1b) Vel.: V1b Rotation: R1b | Pos.: (X2b, Y2b) Vel.: V2b Rotation: R2b | Pos.: (X3b, Y3b) Vel.: V3b Rotation: R3b | Pos.: (X4b, Y4b) Vel.: V4b Rotation: R4b |

As shown in example of Table 2 above, a position, a velocity and a rotation of the ego vehicle are not defined at the second time point (i.e., Time Point 2) and the third time point (i.e., Time Point 3). In this case, the scenario editing apparatus 100 may auto-generate the points or frames between the first time point and the fourth time point. By way of example, at the first time point, the relative position, velocity and rotation between the ego vehicle and the non-ego vehicle may be determined based on the position (X1a, Y1a), the velocity V1a, and the rotation R1 a of the ego vehicle and the position (X1b, Y1b), the velocity V1b and the rotation R1b of the non-ego vehicle. Based on the determined relative position, velocity and rotation, the missing points or frames at the second time point and the third time point between the first time point and the fourth time point of the ego vehicle may be determined, e.g., via interpolation using the positions, velocities, and rotations of the ego vehicle at the first time point and the fourth time point. In addition, the scenario editing apparatus 100 may also provide a user interface in which the time synchronized positions may be set directly on a displayed map or representation of the scene to be simulated (e.g., representation of the road).

Figure 3:
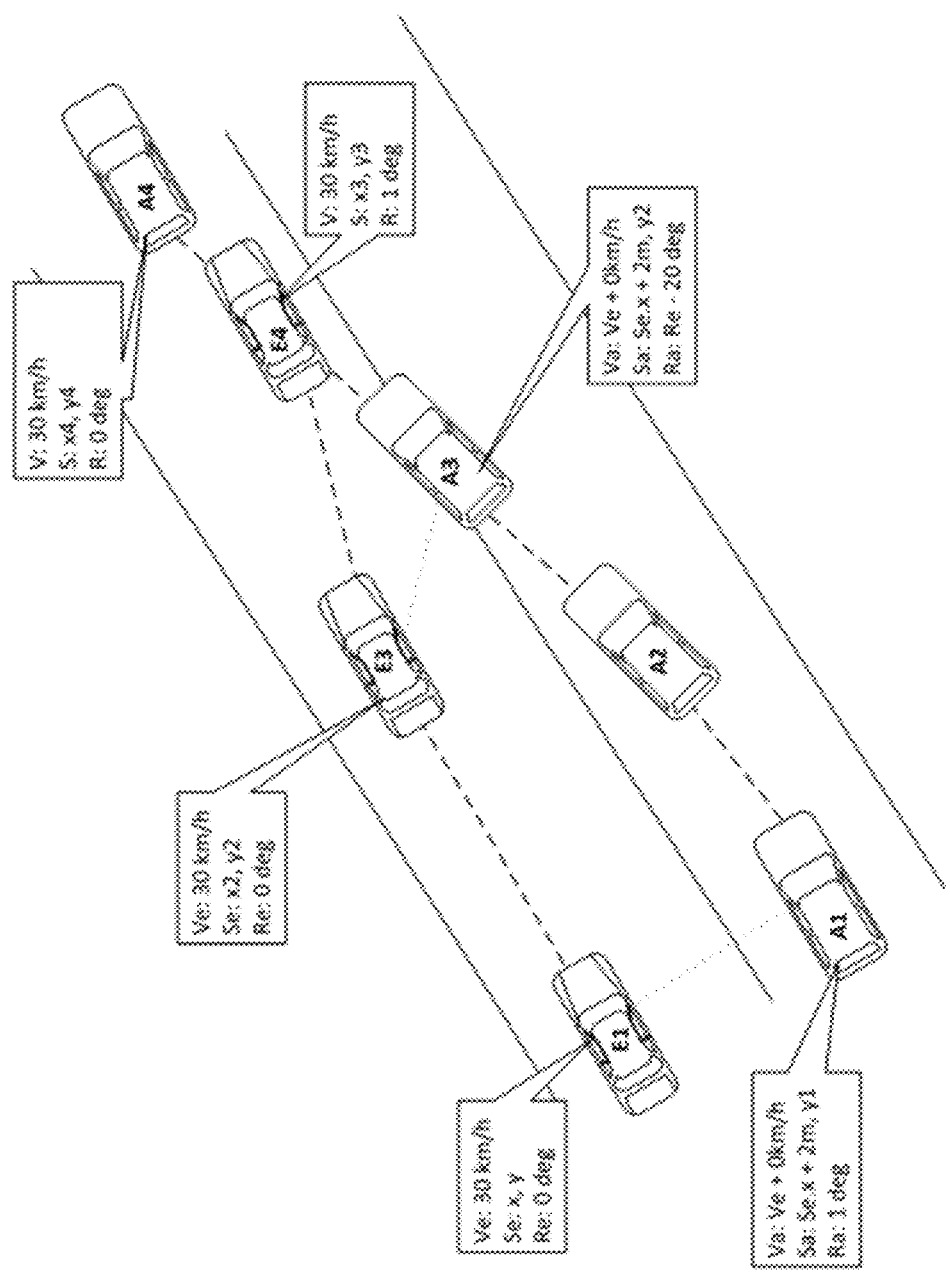
FIG. 3 is a schematic diagram illustrating an exemplary interface for editing a scenario of an autonomous driving simulation according to an embodiment.

FIG. 3 is a schematic diagram illustrating an exemplary interface for editing a scenario of an autonomous driving simulation according to an embodiment.

According to an embodiment, the processor 110 of the scenario editing apparatus 100 may control the display 130 to display a user interface for creating or editing a scenario of an autonomous driving simulation, including a first target object (e.g., an ego vehicle E1-E4) and a second target object (e.g., a non-ego vehicle A1-A4), as shown in FIG. 3. As described above with reference to FIG. 1, the apparatus 100 may receive user inputs through the input/output interface 150.

The time-synchronized attributes of the first and second target objects may be input to a user interface screen (such as illustrated in FIG. 3) in various manners according to various embodiments. For example, the attributes may be input via text input, e.g., to a pop-up window or box displayed in proximity to the corresponding target object. The locations or positions of the target objects may be input or modified via drag and drop operations with respect to the corresponding target object.

Referring to FIG. 3, an ego vehicle E1-E4 travels in one trajectory and a non-ego vehicle A1-A4 travels in another trajectory. Here, the time synchronized attributes (e.g., action attributes) of the ego vehicle E and the non-ego vehicle A at different time points are displayed. For example, at the first time point, the ego vehicle E1 is located at (x, y) and is traveling at a velocity of 30 km/h with a rotation of 0 degree. Further, at the first time point, the time synchronized attributes of the non-ego vehicle A1 are displayed in relation to the ego vehicle E1. For example, the non-ego vehicle A1 is located at position (Se.x+2m, y1) and is traveling at Ve+0 km/h with a rotation of 1 degree.

Furthermore, at the third time point, the ego vehicle E3 is located at (x2, y2) and is traveling at a velocity of 30 km/h with a rotation of 0 degree, and the non-ego vehicle A3 is located at (Se.x+2m, y1) and is travelling at a velocity of Ve+0 km/h with a rotation of −20 degrees. Here, it is noted that the attributes of the non-ego vehicle A2 at the second time point are not displayed on the user interface. As discussed above, the attributes of the non-ego vehicle A2 may be determined or interpolated based on the time synchronized attributes of the non-ego vehicle A2 at the first point and the third point.

Figure 4:
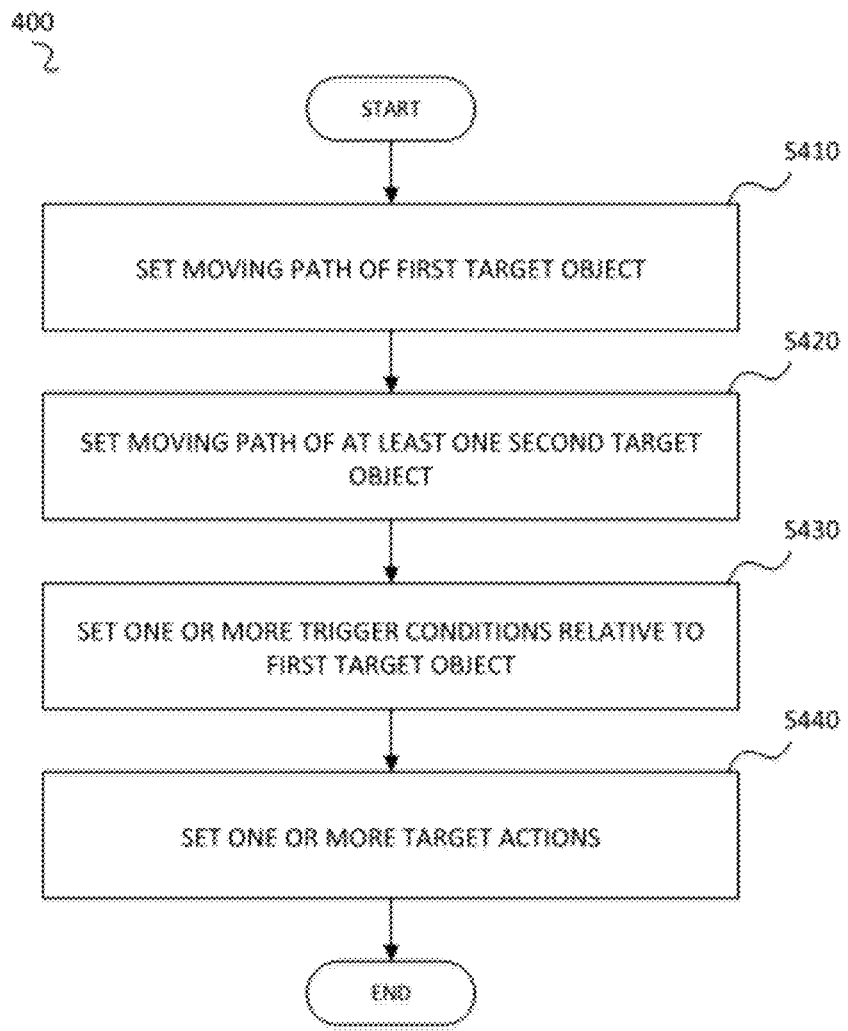
FIG. 4 is a flowchart illustrating a method of providing a simulation scenario that defines a trigger condition and a target action according to an embodiment.

FIG. 4 is a flowchart illustrating a method of providing a simulation scenario that defines a trigger condition and a target action according to another embodiment. In the embodiment of FIG. 4, a scenario editing apparatus and method defines actions or behaviors of one or more second target objects (e.g., non-ego vehicle, pedestrian, etc.) vis-à-vis trigger conditions relative to a first target object (e.g., ego-vehicle). In other words, triggers are set for one or more dynamic objects (such as non-ego-vehicle, pedestrian, etc.) in the scenario. The trigger may be defined by one or more conditions relative to the first target object (e.g., ego-vehicle) and one or more actions if the condition(s) is met.

According to an embodiment, a method 400 of providing a simulation scenario that defines a trigger condition and a corresponding target action may be performed or controlled, via executing instructions, by the processor 110 of the scenario editing apparatus 100 (shown in FIG. 1).

Referring to FIG. 4, a moving path of a first target object is set in step 410. For example, one or more locations of the first target object (e.g., ego vehicle) in the simulation may be set in step S410. In particular, a starting location and an ending location of the first target object may be set, in addition to a velocity of the first target object. Additionally, one or more locations following a starting location of the first target object may be defined. The set locations define a moving path of the first target object during the simulation.

In step 420, a moving path of at least one second target object is set. For example, one or more locations of at least one second target object (e.g., non-ego vehicle) are set. In particular, a starting location and an ending location of a second target object may be set, in addition to a velocity of the second target object. Additionally, one or more locations following a starting location of the second target object may be defined. The set locations define a moving path of the second target object during the simulation The moving paths of the first and second target objects may be set by user inputs via a user interface screen such as described above with reference to FIG. 3.

In step S430, one or more trigger conditions relative to the first target object (e.g., ego vehicle) may be set or defined. The one or more trigger conditions may be set for one or more second target objects, e.g., non-ego vehicles (or dynamic objects, such as pedestrian, etc.) in the scenario. For example, the one or more trigger conditions may include at least one of first target object speed, first target object location, a range of distance from the first target object, an active area (e.g., an area within the range), or a second target object type (e.g., non-ego vehicle, pedestrian, etc.). The one or more trigger conditions may be triggered when at least one trigger condition relative to the first target object is met. Alternatively, the one or more trigger conditions may be triggered when a set combination of trigger conditions are satisfied.

Furthermore, in step S440, one or more target actions may be set or defined. The one or more target actions may include a first target object speed, a second target object speed, a destination of the second target object, the second target object's relative distance or location from the first target object, or a time to collision between the second target object and the first target object based on the respective speed and location of the second target object and the first target object.

The one or more trigger conditions and one or more target actions may be set by user inputs via a user interface screen such as described above with reference to FIG. 3.

Although examples of one or more trigger conditions and the one or more target actions have been described above, it is understood that one or more other embodiments are not limited thereto, and the one or more trigger conditions and the one or more target actions may include other factors that may be relevant to the autonomous driving simulation.

Figure 5:
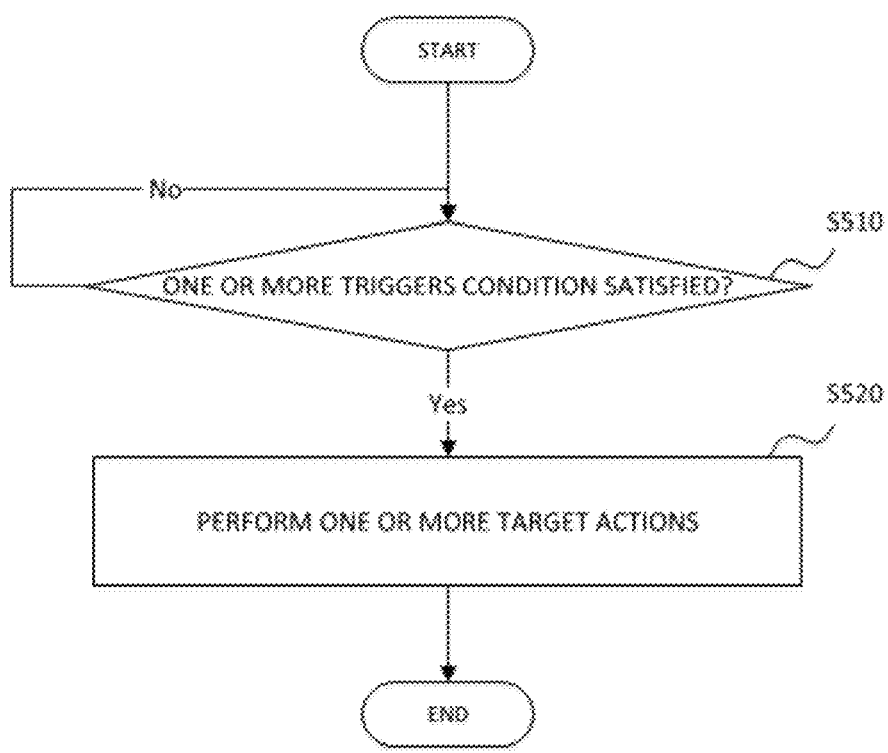
FIG. 5 is a flowchart illustrating a method of running a simulation scenario defined by a set trigger condition and a set target action according to an embodiment.

FIG. 5 is a flowchart illustrating a method of running a simulation scenario defined by a set trigger condition and a set target action according to another embodiment.

Referring to FIG. 5, the simulation is run and it is determined whether one or more user-defined trigger conditions are satisfied in step S510. If the one or more trigger conditions are not satisfied (Step 510: No), Step S510 is repeated until the one or more trigger conditions are satisfied or until the simulation ends.

Meanwhile, if the one or more trigger conditions are satisfied (Step S510: Yes), then one or more user-defined target actions are performed in Step S520.

By way of example, a user may want to test the behavior of an ego vehicle if a non-ego vehicle cuts in front of the ego vehicle and reduces its speed to be below the speed of the ego vehicle. In this case, the scenario of the simulation may be created or edited such that the target conditions include an ego vehicle speed of at least 50 km/h, a range of 5 meters (or 5 meters or less), an active area between 80 degrees and 100 degrees (i.e., an area corresponding to a cut-in location along the set moving path of the ego vehicle), and a second target object type of non-ego vehicle. The target action may include reducing the second target object speed to be 5 km/hr less than the current ego vehicle speed. Thus, in executing this scenario, the simulation can test the ego vehicle's behavior when a non-ego vehicle cuts in front of the ego vehicle and reduces its speed to be 5 km/hr less than that of the ego-vehicle. That is, if the non-ego vehicle cuts within 5 meters of the ego vehicle in an area between 80 degrees and 100 degrees around the ego vehicle while the ego vehicle is driving at 50 km/hr, then the trigger conditions would be determined as met in step S510. Accordingly, the target action of reducing the non-ego vehicle's speed to be 45 km/hr would be performed, and a user can test how the ego vehicle responds to this target action in the scenario.

Although the example above only describes that the target action of the non-ego vehicle (or the second target object) is controlled based on the trigger condition being satisfied, it is understood that other embodiments are not limited thereto, and the target action may be performed or controlled on the ego vehicle (or the first target object) as well. Therefore, by setting trigger conditions based on a relationship between a first target object (e.g., an ego vehicle) and at least one second target object (e.g., a non-ego vehicle), and setting target actions to control the first target object and/or the at least one second target object, the simulation environment may be enriched by including various factors in the simulation of the ego vehicle and the behavior of the ego vehicle may be tested more accurately. The user interface allowing for the setting of such conditions and actions thereby gives users greater flexibility and ease in creating desired scenarios.

Figure 6:
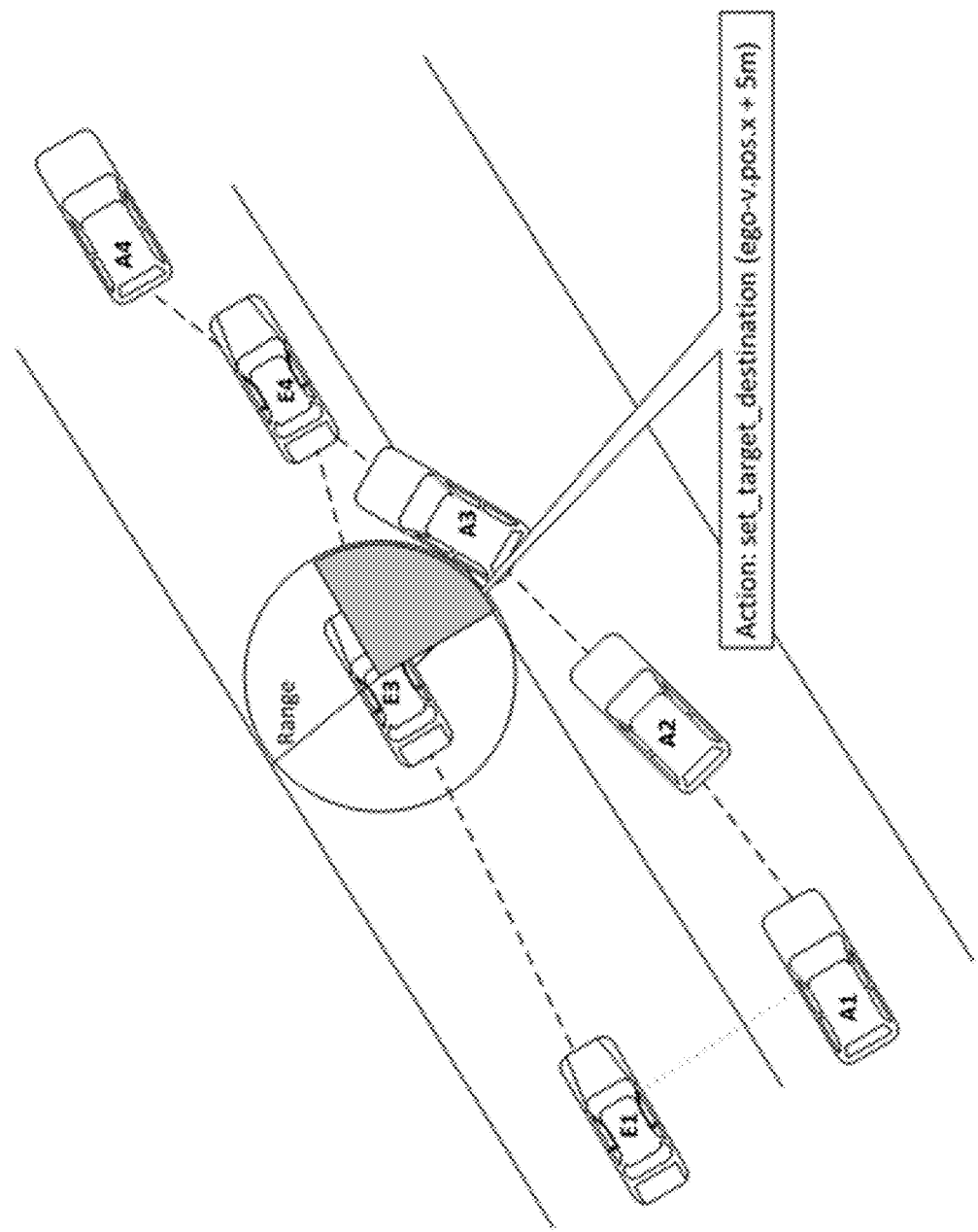
FIG. 6 is a schematic diagram illustrating an exemplary interface for editing an autonomous driving simulation scenario using a triggering condition, according to an embodiment.

FIG. 6 is a schematic diagram illustrating an exemplary interface for editing an autonomous driving simulation scenario using a trigger condition, according to an embodiment.

As described above with reference to FIG. 4, one or more trigger conditions relative to the ego vehicle may be set or defined to control the actions of the non-ego vehicle or target objects. According to an embodiment, the processor 110 of the scenario editing apparatus 100 may control the display 130 to display a user interface for simulating the one or more triggering conditions and one or more target actions as shown in FIG. 5.

By way of example, when a trigger condition is set or defined such that, if a range of distance of a second target object (e.g., a non-ego vehicle A1-A4) from a first target object (e.g., an ego vehicle E1-E4) is within a predetermined range, it is determined that the trigger condition is satisfied and one or more target actions may be performed. Here, when the non-ego vehicle A3 is within the predetermined range (i.e., grey area) of the ego vehicle E3, a user-defined target action that causes the ego vehicle E3 to travel to a destination (ego-v.pos.x+5m) may be performed in the simulation.

Embodiments of the disclosure have been shown and described above, however, the embodiments of the disclosure are not limited to the aforementioned specific embodiments. It may be understood that various modifications, substitutions, and improvements can be made by those having ordinary skill in the art in the technical field to which the disclosure belongs, without departing from the spirit of the disclosure as claimed by the appended claims. It should be understood that such modifications, substitutions, and improvements shall fall within the protection scope of the disclosure, and should not to be construed independently from the technical idea or prospect of the disclosure.

What is claimed is:

1. A method of creating a scenario for an autonomous driving simulation, the method comprising:
    setting, based on a first user input, a location of a first target object at each of a first plurality of time points on a map displayed on a graphical user interface (GUI) for a simulation scenario, the first plurality of time points comprising a first time point and a third time point corresponding to a user-defined trajectory of the first target object, the user-defined trajectory specifying a starting point and an end point of the first target object, the plurality of time points displayed in the GUI;
    defining, based on a second user input, an action of a second target object that is different from the first target object in relation to at least one of the set locations of the first target object; and
    executing the simulation scenario such that a movement of the first target object is displayed along the user-defined trajectory with respect to a movement of the second target object in the GUI.

2. The method of claim 1, wherein the defining the action of the second target object comprises:

setting, based on the second user input, a location of the second target object at each of a second plurality of time points on the map, the second plurality of time points comprising the first time point, the third time point, and a second time point between the first time point and the third time point.

3. The method of claim 2, further comprising:
determining a location of the first target object at the second time point based on the set location of the first target object at the first time point and the set location of the first target object at the third time point.

4. The method of claim 1, further comprising:
setting, for each of the first plurality of time points, at least one of a user-defined velocity and a user-defined rotation of the first target object; and
wherein the defining the action of the second target object comprises:
setting, based on the second user input, a location of the second target object at each of a second plurality of time points on the map, the second plurality of time points comprising the first time point and the third time point, and
setting, for each of the second plurality of time points, at least one of a user-defined velocity and a user-defined rotation of the second target object.

5. The method of claim 1, wherein the defining the action of the second target object comprises:
setting a user-defined trigger condition relative to the at least one of the set locations of the first target object, and a user-defined target action of the second target object to be performed based on the trigger condition being satisfied.

6. The method of claim 5, wherein:
the user-defined trigger condition comprises at least one of a velocity of the first target object, a range from the first target object, an active area, and a second target object type; and
the user-defined target action comprises at least one of the second target object relative velocity relative to the velocity of the first target object, second target object relative distance or location relative to the first target object, and a time to collision.

7. The method of claim 1, wherein the first target object is an ego vehicle and the second target object is a non-ego vehicle.

8. An apparatus for creating a scenario for an autonomous driving simulation, comprising:
at least one processor configured to:
set, based on a first user input, a location of a first target object at each of a first plurality time points on a map displayed on a graphical user interface (GUI) for a simulation scenario, the first plurality of time points comprising a first time point and a third time point corresponding to a user-defined trajectory of the first target object, the user-defined trajectory specifying a starting point and an end point of the first target object, the plurality of time points displayed in the GUI;
define, based on a second user input, an action of a second target object that is different from the first target object in relation to at least one of the set locations of the first target object; and
execute the simulation scenario such that a movement of the first target object is displayed along the user-defined trajectory with respect to a movement of the second target object in the GUI.

9. The apparatus of claim 8, wherein the at least one processor is further configured to set, based on the second user input, a location of the second target object at each of a second plurality of time points on the map, the second plurality of time points comprising the first time point, the third time point, and a second time point between the first time point and the third time point.

10. The apparatus of claim 9, wherein the at least one processor is further configured to determine a location of the first target object at the second time point based on the set location of the first target object at the first time point and the set location of the first target object at the third time point.

11. The apparatus of claim 8, wherein the at least one processor is further configured to:
set, for each of the first plurality of time points, at least one of a user-defined velocity and a user-defined rotation of the first target object;
set, based on the second user input, a location of the second target object at each of a second plurality of time points on the map, the second plurality of time points comprising the first time point and the third time point; and
set, for each of the second plurality of time points, at least one of a user-defined velocity and a user-defined rotation of the second target object.

12. The apparatus of claim 8, wherein the at least one processor is further configured to set a user-defined trigger condition relative to the at least one of the set locations of the first target object, and a user-defined target action of the second target object to be performed based on the trigger condition being satisfied.

13. The apparatus of claim 12, wherein:
the user-defined trigger condition comprises at least one of a velocity of the first target object, a range from the first target object, an active area, and a second target object type; and
the user-defined target action comprises at least one of second target object relative velocity relative to the velocity of the first target object, second target object relative distance or location relative to the first target object, and a time to collision.

14. The apparatus of claim 8, wherein the first target object is an ego vehicle and the second target object is a non-ego vehicle.

15. A non-transitory computer-readable storage medium, storing instructions executable by at least one processor to perform a method comprising:
setting, based on a first user input, a location of a first target object at each of a first plurality time points on a map displayed on a graphical user interface (GUI) for a simulation scenario, the first plurality of time points comprising a first time point and a third time point corresponding to a user-defined trajectory of the first target object, the user-defined trajectory specifying a starting point and an end point of the first target object, the plurality of time points displayed in the GUI;
defining, based on a second user input, an action of a second target object that is different from the first target object in relation to at least one of the set locations of the first target object; and
executing the simulation scenario such that a movement of the first target object is displayed along the user-defined trajectory with respect to a movement of the second target object in the GUI.

* * * * *